United States Patent
Yokoyama

(10) Patent No.: US 8,456,025 B2
(45) Date of Patent: Jun. 4, 2013

(54) SEMICONDUCTOR CHIP HAVING STAGGERED ARRANGEMENT OF BONDING PADS

(75) Inventor: Kenji Yokoyama, Kyoto (JP)

(73) Assignee: Panasonic Corporation, Osaka (JP)

( * ) Notice: Subject to any disclaimer, the term of this patent is extended or adjusted under 35 U.S.C. 154(b) by 7 days.

(21) Appl. No.: 13/220,860

(22) Filed: Aug. 30, 2011

(65) Prior Publication Data
US 2011/0309515 A1 Dec. 22, 2011

Related U.S. Application Data

(63) Continuation of application No. PCT/JP2010/000442, filed on Jan. 27, 2010.

(30) Foreign Application Priority Data

Jun. 12, 2009 (JP) ................................. 2009-140880

(51) Int. Cl.
*H01L 23/48* (2006.01)

(52) U.S. Cl.
USPC ............. 257/786; 257/E23.021; 257/E23.069

(58) Field of Classification Search
None
See application file for complete search history.

(56) References Cited

U.S. PATENT DOCUMENTS

| | | | | |
|---|---|---|---|---|
| 6,323,559 B1* | 11/2001 | Chan et al. | ..................... | 257/778 |
| 6,407,462 B1* | 6/2002 | Banouvong et al. | .......... | 257/787 |
| 6,762,495 B1* | 7/2004 | Reyes et al. | ..................... | 257/737 |
| 7,098,538 B1 | 8/2006 | Tago et al. | | |
| 7,242,093 B2* | 7/2007 | Ueda | ............... | 257/737 |
| 7,269,028 B2* | 9/2007 | Csonka et al. | ................. | 361/777 |
| 7,297,575 B2 | 11/2007 | Tago et al. | | |
| 7,391,122 B1* | 6/2008 | Hool | .............................. | 257/786 |
| 7,446,398 B2* | 11/2008 | Niu et al. | ........................ | 257/668 |
| 8,129,837 B2* | 3/2012 | Pendse | ........................... | 257/691 |
| 2002/0113319 A1* | 8/2002 | Ohno | .............................. | 257/778 |
| 2003/0011071 A1 | 1/2003 | Kariyazaki | | |
| 2006/0065965 A1* | 3/2006 | Ohsaka | .......................... | 257/690 |
| 2006/0097408 A1* | 5/2006 | Song | .............................. | 257/786 |
| 2007/0108628 A1* | 5/2007 | Ozawa et al. | ................. | 257/778 |

FOREIGN PATENT DOCUMENTS

| | | |
|---|---|---|
| JP | 09-172105 | 6/1997 |
| JP | 11-195681 | 7/1999 |
| JP | 2001-024089 | 1/2001 |
| JP | 2001-118946 | 4/2001 |
| JP | 2002-190526 | 7/2002 |
| JP | 2003-007750 | 1/2003 |
| JP | 2005-142281 | 6/2005 |
| JP | 2007-173388 | 7/2007 |

OTHER PUBLICATIONS

International Search Report of PCT Application No. PCT/JP2010/000442 dated Apr. 20, 2010.

* cited by examiner

*Primary Examiner* — Alonzo Chambliss

(74) *Attorney, Agent, or Firm* — McDermott Will & Emery LLP

(57) ABSTRACT

A semiconductor integrated circuit device includes a semiconductor chip including input/output cells, pads formed on a surface of the semiconductor chip, and interconnects formed on the surface of the semiconductor chip to electrically connect at least some of the plurality of input/output cells and at least some of the plurality of pads. A first plurality of the pads located in a center portion of the semiconductor chip are arranged in a rectangular dot grid pattern, and a second plurality of the pads located in at least one of four corner portions of the semiconductor chip are arranged in a staggered dot pattern.

16 Claims, 9 Drawing Sheets

SEMICONDUCTOR CHIP HAVING STAGGERED ARRANGEMENT OF BONDING PADS

CROSS-REFERENCE TO RELATED APPLICATION

This is a continuation of PCT International Application PCT/JP2010/000442 filed on Jan. 27, 2010, which claims priority to Japanese Patent Application No. 2009-140880 filed on Jun. 12, 2009. The disclosures of these applications including the specifications, the drawings, and the claims are hereby incorporated by reference in their entirety.

BACKGROUND

The present disclosure relates to semiconductor integrated circuit devices applicable to flip-chip mounting, and a method for designing the same.

As technologies for manufacturing semiconductor devices continue to progress in densification and miniaturization, the number of transistors constituting a large scale integrated circuit (LSI) continues to increase. As the number of components constituting the LSI increases, increase in area of a semiconductor chip is a growing concern. Thus, reducing the area of the chip is one of the most important issues in view of reduction in manufacturing cost. In general, a wire bonding method is employed to connect the LSI and a package for mounting the LSI. When this mounting method is employed, input/output (IO) cells of the LSI are arranged on a peripheral portion of the semiconductor chip.

The above-described structure is disadvantageous because the chip area increases depending on the number of the input/output cells. Further, when the wire bonding method is employed, wires have to be press-bonded to the input/output cells, and the input/output cells need a predetermined size or larger to maintain their strength so that the input/output cells do not break when the wires are press-bonded thereto. Since a certain area is required in press-bonding the wires, the input/output cells cannot be physically reduced in size. Accordingly, in a miniaturization process, the chip area is limited by the input/output cells when the number of the input/output cells in the chip increases. Even when a technique of synthesizing placement of internal logics is used to reduce the area, the chip area cannot be reduced as a whole.

A solution to the above-described disadvantage is a flip-chip structure. FIG. 17 shows a structure of a semiconductor chip constituting a conventional flip-chip semiconductor integrated circuit device in a plan view, and FIG. 18 shows a cross-sectional view of the structure of the flip-chip semiconductor integrated circuit device. As shown in FIG. 17, a plurality of pads 12 are arranged on an entire region of an upper surface of a chip (LSI) 21. The pads 12 are electrically connected to input/output cells 11 arranged on a peripheral portion of the chip 21 through interconnects 13 called redistribution interconnects, respectively. FIG. 18 shows a cross-sectional view of the chip 21 of FIG. 17 connected to a package 22.

As shown in FIG. 18, the chip 21 is fixed face down to a surface of the package 22, and is electrically connected to the package 22 through the pads 12. The chip 21 on an upper surface of the package 22 is coated with a sealing resin 23. A plurality of external electrodes 24 are provided on a rear surface of the package 22. When this flip-chip structure is employed, wiring between the pads 12 and the input/output cells 11 is no longer necessary, and the input/output cells 11 can be reduced in size as compared with those of the conventional structure. Further, there is no need to arrange the multiple input/output cells 11 only on the peripheral portion of the chip 21, i.e., on the peripheral portion of the LSI. This can resolve the disadvantage involved in the wire bonding method, i.e., the area of the LSI is determined by the input/output cells 11.

In the following description, the pads 12 arranged on the entire surface of the chip 21 in a flip-chip manner will be referred to as area pads.

In the flip-chip structure, the interconnects 13 connecting the area pads 12 arranged on the surface of the chip 21 and the input/output cells (10 cells) 11 arranged on the peripheral portion of the chip 21 have to be efficiently designed. Specifically, when the number of the area pads 12 is drastically increased by forming the area pads on the entire surface of the chip, the number of the interconnects between the area pads 12 and the input/output cells 11 increases, and length of the interconnects increases.

Unless this problem is solved, the chip area increases, and timing performance of the interconnects 13 connected to the input/output cells 11 cannot satisfy predetermined requirements. This may reduce performance of the LSI.

As a solution to this disadvantage, Japanese Patent Publications Nos. 2003-007750 and 2007-173388 teach a technique of placing the area pads on the peripheral portion at an increased pitch, thereby allowing efficient routing of the interconnects between the area pads and the input/output cells.

SUMMARY

According to the method described in Japanese Patent Publication No. 2003-007750, the increased pitch between the area pads on the peripheral portion of the LSI reduces the number of the pads on the LSI, and the area of the chip has to be increased. This leads to another problem of increased manufacturing cost.

The method described in Japanese Patent Publication No. 2007-173388 is intended to achieve efficient connection with an interposer for leading the interconnects of the LSI outside, and is not intended to reduce the manufacturing cost by reducing the area of the LSI.

In view of the foregoing, the present disclosure is concerned with reducing the manufacturing cost of the semiconductor integrated circuit device applicable to flip-chip mounting by reducing the size of the chip.

In view of the above concerns, as well as other objectives, the placements of the pads and the input/output cells, and the shape of the pads are determined in advance in a design phase of the LSI of the semiconductor integrated circuit device in such a manner that the interconnects can efficiently be routed, and the length of the interconnects between the pads and the input/output cells can be shortened.

Specifically, a semiconductor integrated circuit device according to a first aspect includes: a semiconductor chip including input/output cells; pads formed on a surface of the semiconductor chip; and interconnects formed on the surface of the semiconductor chip to electrically connect one or more of the input/output cells and one or more of the pads, wherein a first plurality of the pads located in a center portion of the semiconductor chip are arranged in a rectangular dot grid pattern, and a second plurality of the pads located in at least one of four corner portions of the semiconductor chip are arranged in a staggered dot pattern.

According to the semiconductor integrated circuit device of the first aspect, the second plurality of the pads located in the at least one of the four corner portions of the semiconductor chip are arranged in the staggered dot pattern. This can reduce the length of the interconnects between the pads formed in the one of the corner portions and the input/output cells, thereby reducing the area of the semiconductor chip, and improving an electrical characteristic of the semiconductor chip.

In the semiconductor integrated circuit device according to the first aspect, each of the pads arranged in the rectangular dot grid pattern may be in the shape of a rectangle when viewed in plan, and each of the pads arranged in the staggered dot pattern may be in the shape of a rectangle which is tilted at an angle of 45° relative to the rectangular shape of the pads arranged in the rectangular dot grid pattern when viewed in plan.

With this configuration, the pads which are rectangular and tilted at an angle of 45°, and arranged in the corner portion in the staggered dot pattern are connected to the input/output cells through the short interconnects. In connecting the interconnects routed at an angle of 45° and the pads arranged in the staggered dot pattern, the interconnects can efficiently be routed without causing errors derived from a design rule at a joining portion between the interconnect and the pad.

In the semiconductor integrated circuit device according to the first aspect, a surface metal layer of each of the plurality of pads may be in the shape of a rectangle when viewed in plan, and a lower metal layer below the surface metal layer of each of the pads arranged in the staggered dot pattern may be in the shape of a rectangle which is tilted at an angle of 45° relative to the rectangular shape of the surface metal layer when viewed in plan.

With this configuration, in connecting the interconnects routed at an angle of 45° and the pads arranged in the staggered dot pattern, the interconnects can efficiently be routed without causing errors derived from a design rule at a joining portion between the interconnect and the pad.

In the semiconductor integrated circuit device according to the first aspect, the pads arranged in the rectangular dot grid pattern may be power supply terminals, and the pads arranged in the staggered dot pattern may be signal terminals.

With this configuration, power supply interconnects can efficiently be routed in the shape of a grid or a mesh in the center portion of the chip, and a potential of the semiconductor chip can be stabilized on the entire surface thereof. This can improve reliability and performance of the chip.

In the semiconductor integrated circuit device according to the first aspect, pads may not be provided in a pad forming region or a region around the pad forming region of a designated area where density of the interconnects is high.

With this configuration, the interconnects in the chip are preferentially routed in a region where the density of the interconnects is relatively high, and pads having a relatively large area are arranged in a region where the density of the interconnects is relatively low. Thus, the interconnects can efficiently be used throughout the semiconductor chip.

In the semiconductor integrated circuit device according to the first aspect, pads may not be provided in a pad forming region or a region around the pad forming region of a designated area where an analog element is present.

With this configuration, interference between an element whose characteristic is likely to be impaired, such as the analog element etc., and the pads and the interconnects can be avoided. This can improve reliability of the semiconductor chip as a whole.

In the semiconductor integrated circuit device according to the first aspect, one or more rows of the pads closest to an outer perimeter of the semiconductor chip may be power supply terminals.

With this configuration, not only a power supply voltage in the center portion of the chip, but also a power supply voltage in the peripheral portion of the chip, can be stabilized. When the pads arranged on the peripheral portion of the chip which are likely to be affected by warpage of the chip in mounting the chip are used as the power supply terminals, reliability of the chip as a whole can be improved.

A method for designing the semiconductor integrated circuit device includes: calculating a density of the interconnects in each of pad forming regions or regions around the pad forming regions of a designated area using layout data based on a determined floor plan, and on determined placement of area pads; and removal of some of the plurality of pads from the regions of the designated area in descending order of the density of the interconnects.

According to the method for designing the semiconductor integrated circuit device, the interconnects in the chip are preferentially routed in a region where the density of the interconnects is relatively high, and pads having a relatively large area are placed in a region where the density of the interconnects is relatively low. Thus, the interconnects can efficiently be used throughout the semiconductor chip.

A semiconductor integrated circuit device according to a second aspect includes: a semiconductor chip including a plurality of input/output cells; a plurality of pads formed on a surface of the semiconductor chip; and interconnects formed on the surface of the semiconductor chip to electrically connect at least some of the plurality of input/output cells and at least some of the plurality of pads, wherein the plurality of input/output cells are arranged in standard cell regions for arranging standard cells.

In the semiconductor integrated circuit device according to the second aspect, the plurality of input/output cells are arranged in the standard cell regions for arranging the standard cells. This can shorten the interconnects between the pads.

In the semiconductor integrated circuit device according to the second aspect, the plurality of input/output cells may be two or more times taller than the standard cells.

With this configuration, the standard cell regions can also be used as regions for arranging the input/output cells, and the area of the semiconductor chip can efficiently be used.

In the semiconductor integrated circuit device according to the second aspect, power supply cells may be arranged around the plurality of input/output cells.

With this configuration, a potential around the input/output cells which are likely to consume larger power than the standard cells can be stabilized, thereby improving reliability of operation of the semiconductor chip.

The semiconductor integrated circuit device according to the second aspect may further include a dedicated power supply interconnect which is formed around the plurality of input/output cells, and is connected to the input/output cells.

With this configuration, a potential around the input/output cells which are likely to consume larger power than the standard cells can be stabilized, thereby improving reliability of operation of the semiconductor chip.

In the semiconductor integrated circuit device according to the second aspect, the standard cells may not be arranged in a region adjacent to the input/output cells arranged in the standard cell region.

With this configuration, the standard cells are not affected by the operation of the input/output cells which are likely to consume larger power than the standard cells, and disadvantages derived from drop of an operating voltage of the standard cells can be prevented.

The semiconductor integrated circuit device according to the second aspect may further include power supply capacitor cells arranged in a peripheral portion of the semiconductor chip.

With this configuration, the potential around the input/output cells which are likely to consume larger power than the standard cells can be stabilized, thereby improving reliability of operation of the semiconductor chip.

The semiconductor integrated circuit device according to the second aspect may further include ESD protection circuit elements used together with the input/output cells.

With this configuration, a region for forming the input/output cells can be reduced, and the area and the cost of the chip can be reduced.

A method for designing the semiconductor integrated circuit device includes: placing the plurality of pads; placing the plurality of input/output cells in the standard cell regions after the placement of the plurality of pads; and placing LSI internal circuit elements after the placement of the plurality of input/output cells.

According to the method for designing the semiconductor integrated circuit device, the pads can preferentially be placed, thereby allowing efficient signal connection between the pads and the outside of the chip.

A method for designing the semiconductor integrated circuit device includes: placing LSI internal circuit elements; placing the plurality of input/output cells in the standard cell regions after the placement of the LSI internal circuit elements; and placing the plurality of pads after the placement of the plurality of input/output cells.

According to the method for designing the semiconductor integrated circuit device, the internal circuit elements can preferentially be placed, thereby improving performance of circuit operation in the chip.

In the above methods for designing the semiconductor integrated circuit device, an interconnect resistance value, an interconnect capacity value, a constraint value for signal arrival time, a constraint value for interconnect length, or a constraint value for interconnect fanout is preferably set, and a constraint on the interconnects requiring that the set value is equal to or less than a predetermined value is preferably satisfied in placing the LSI internal circuit elements, the plurality of input/output cells, and the plurality of pads.

With this configuration, the inside and the outside of the chip can accurately and efficiently be connected.

According to the semiconductor integrated circuit device, the interconnects which connect the pads and the input/output cells arranged on the surface of the chip of the semiconductor integrated circuit device applicable to flip-chip mounting can efficiently be routed with reduced cost. This can reduce the size of the chip, and can reduce manufacturing cost of the LSI.

DETAILED DESCRIPTION

First Exemplary Embodiment

A semiconductor integrated circuit device according to a first exemplary embodiment, and a method for designing the same will be described in detail with reference to the drawings.

In the first exemplary embodiment, a semiconductor integrated circuit device for improving efficiency in routing interconnects between area pads and input/output cells will be described.

Figure 1:
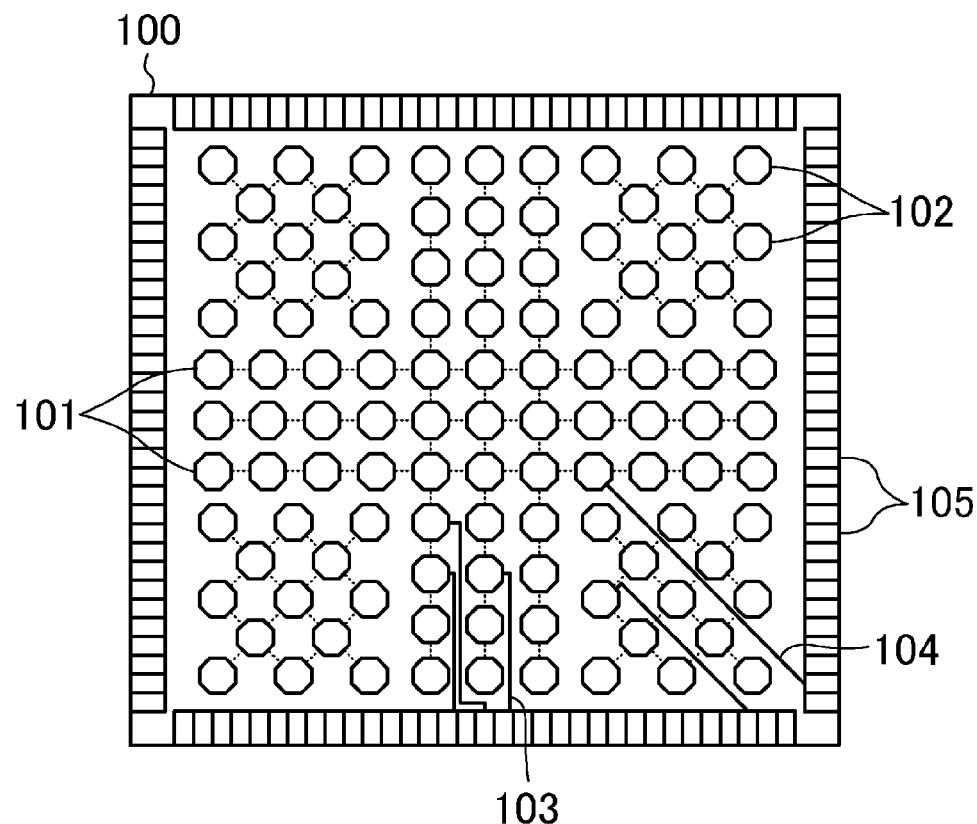
FIG. 1 is a plan view illustrating a semiconductor integrated circuit device according to a first exemplary embodiment.

FIG. 1 is a plan view of the semiconductor integrated circuit device of the first exemplary embodiment. The semiconductor integrated circuit device includes a plurality of first pads 101 which are arranged on a semiconductor chip 100 in a rectangular dot grid pattern, a plurality of second pads 102 arranged in a staggered dot pattern, first pad interconnects 103, second pad interconnects 104, and a plurality of input/output cells 105 arranged on a peripheral portion of the semiconductor chip 100. At least some of the plurality of input/output cells 105 and at least some of the plurality of pads 101, 102 are electrically connected through the pad interconnects 103, 104 formed on a surface of the semiconductor chip 100.

A feature of the present embodiment is that the plurality of first pads 101 arranged in the rectangular dot grid pattern are provided in a center portion of the semiconductor chip 100, and the plurality of second pads 102 arranged in the staggered dot pattern are provided in at least one of four corner portions of the semiconductor chip 100.

When the second pads 102, which are area pads formed on the corner portions of the semiconductor chip 100, are arranged in the staggered dot pattern, the second pad interconnects 104 can be routed at an angle of 45° relative to an outer side of the semiconductor chip. Routing the interconnects at an angle of 45° allows shortening of the interconnects between the pads 101, 102 and the input/output cells 105 formed on the peripheral portion of the semiconductor chip 100. This can reduce an area of the semiconductor chip 100, and can improve an electrical characteristic (performance) of the semiconductor chip 100.

Figure 2:
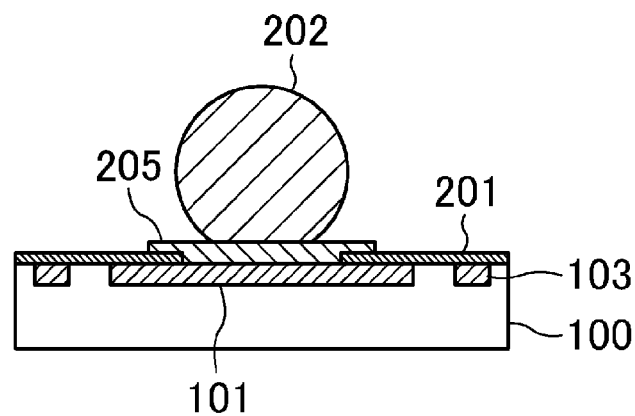
FIG. 2 is a partially enlarged cross-sectional view illustrating a pad of the semiconductor integrated circuit device according to the first exemplary embodiment.

FIG. 2 is a cross-sectional view illustrating an enlargement of the first pad 101 and a region for forming the first pad 101. As shown in FIG. 2, the surface of the semiconductor chip 100 is covered with a protective film 201 having openings positioned above the first pads 101, and a metal plating layer 205 is formed on the first pads 101 to fill the openings. A bump 202 is formed on the metal plating layer 205, and the pad interconnect 103 is formed in an upper portion of the semiconductor chip 100 to be spaced from the first pad 101.

(First Alternative of First Exemplary Embodiment)

Figure 3:
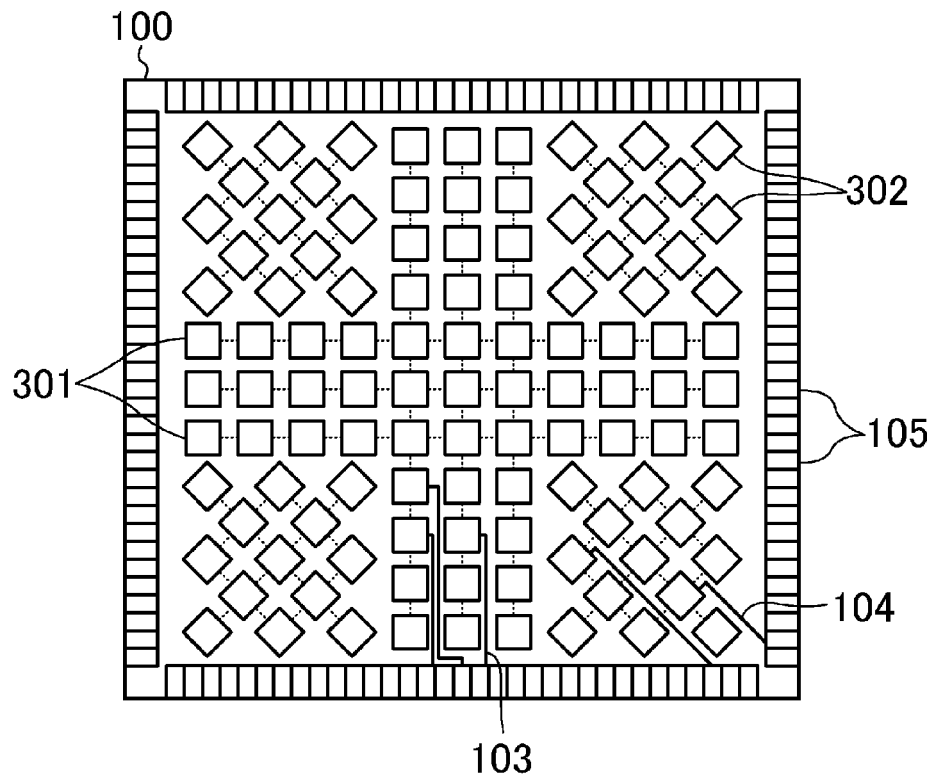
FIG. 3 is a plan view illustrating a semiconductor integrated circuit device according to a first alternative of the first exemplary embodiment.

FIG. 3 is a plan view illustrating the structure of a semiconductor integrated circuit device of a first alternative of the first exemplary embodiment.

A feature of this alternative is that first pads 301 arranged in the rectangular dot grid pattern on the center portion of the semiconductor chip 100 are rectangular shaped when viewed in plan, and second pads 302 arranged in the staggered dot pattern on the corner portions of the semiconductor chip 100 are tilted at an angle of 45° relative to the first pads 301, and are rectangular shaped when viewed in plan. Thus, the second pad interconnect 104 routed at an angle of 45° can intersect with the second pad 302 at an angle of 90° at a joining portion between them.

Figure 4:
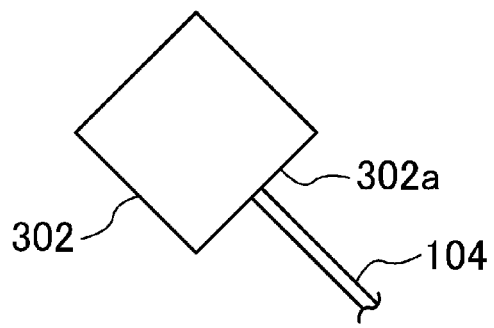
FIG. 4 is a plan view illustrating a pad of the semiconductor integrated circuit device according to the first alternative of the first exemplary embodiment.

FIG. 4 shows an enlargement of the joining portion between one of the second pads 302 arranged in the staggered dot pattern and the second pad interconnect 104. As shown in FIG. 4, the second pad interconnect 104 and the second pad 302 can intersect with each other at an angle of 90° at a point of intersection 302a.

Figure 5:
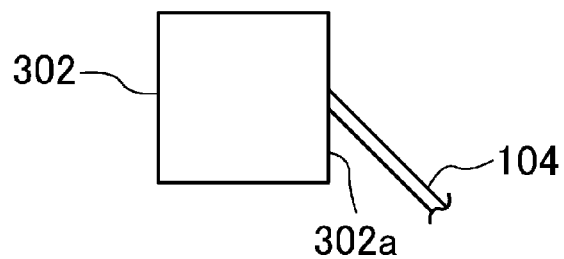
FIG. 5 is a plan view illustrating an exemplary pad to be compared with the first alternative of the first exemplary embodiment.

When a side of the second pad 302 is parallel to an outer side of the semiconductor chip 100 as in a comparative example shown in FIG. 5, the second pad 302 and the second pad interconnect 104 intersect with each other at an angle of 45° at the point of intersection 302a, thereby forming an acute angle portion. The acute angle portion reduces yield of a manufacturing process, thereby increasing manufacturing cost.

(Second Alternative of First Exemplary Embodiment)

In a second alternative, a lower metal layer connected to each of the first pads 301 arranged in the rectangular dot grid pattern shown in FIG. 3 is in the shape of a rectangle parallel to a side of the semiconductor chip 100 in place of a surface portion of each of the first pads, and a lower metal layer of each of the second pads 302 arranged in the staggered dot pattern shown in FIG. 3 is in the shape of a rectangle which is tilted at an angle of 45° relative to the shape of the first pads in place of a surface portion of each of the second pads. This can provide the same advantages as those of the first alternative. In this case, the shape of the surface portion (the upper metal layer) of each of the pads 301, 302 may be quadrangular, polygonal, or circular.

The first pads 301 arranged in the rectangular dot grid pattern on the semiconductor chip 100 may be used as power supply terminals, and the second pads 302 arranged in the staggered dot pattern on the semiconductor chip 100 may be used as signal terminals. With this configuration, the power supply terminals can efficiently be connected through power supply interconnects routed in a grid mesh pattern, and a power supply voltage easily becomes uniform throughout the semiconductor chip 100. When the second pads 302 which can use the second pad interconnects 104 routed at an angle of 45° are used as the signal terminals, the second pads 302 and the input/output cells 105 are efficiently be connected through the short interconnects.

(Third Alternative of First Exemplary Embodiment)

A method for designing the semiconductor integrated circuit device of the first exemplary embodiment will be described with reference to a flowchart shown in FIG. 6.

Figure 6:
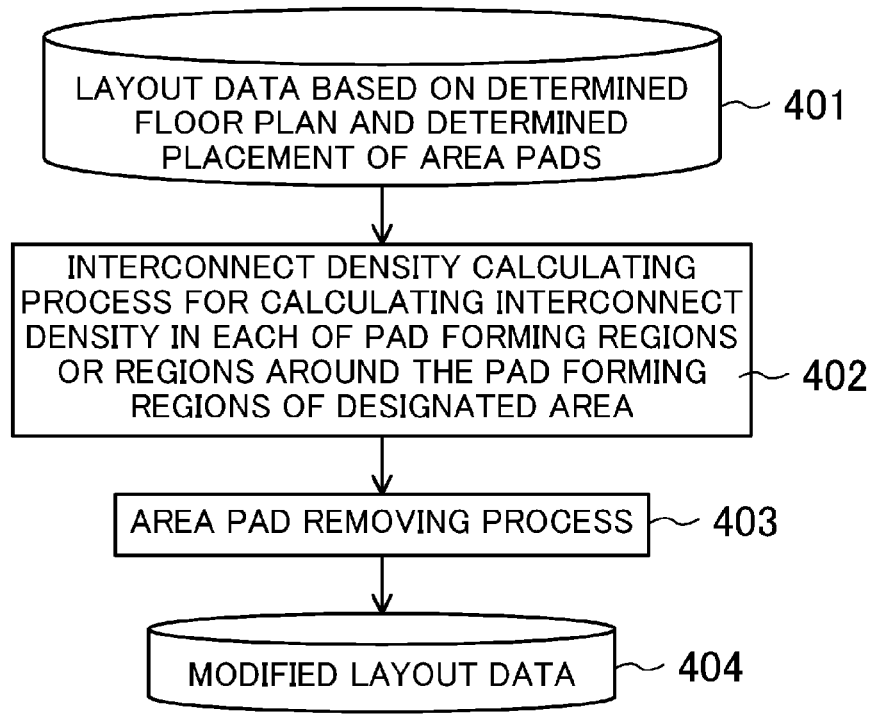
FIG. 6 is a flowchart illustrating a method for designing a semiconductor integrated circuit device according to a third alternative of the first exemplary embodiment.

As shown in FIG. 6, using layout data 401 based on a determined floor plan, and on determined placement of the area pads, an interconnect density calculation process 402 is carried out to calculate density of the interconnects in each region of a designated area, i.e., pad forming regions or regions around the pad forming regions. Thus, ranking of densities of the interconnects near the pads formed on the surface of the semiconductor chip 100 is determined.

Then, in a pad removing process 403, the pads are removed from the regions in descending order of the density of the interconnects, thereby obtaining modified layout data 404.

Figure 7:
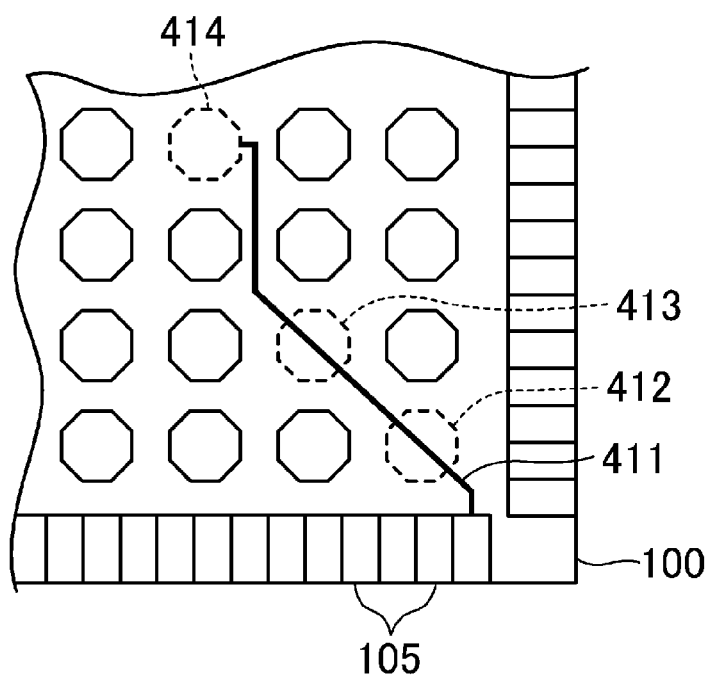
FIG. 7 is a plan view partially illustrating the semiconductor integrated circuit device according to the third alternative of the first exemplary embodiment.

FIG. 7 is a plan view illustrating one of corner portions of a semiconductor integrated circuit device of a third alternative designed by the above method.

For example, when an interconnect 411 passes below the pads 412, 413, and 414 in one of the corner portions of the semiconductor chip 100, it is calculated that the density of the interconnects is high in regions below the pads 412, 413, and 414. As a result, the pads 413, 413, and 414 are removed.

In this way, the pads are removed from the regions in the semiconductor chip 100 where the interconnects are densely routed. This can improve efficiency in routing the interconnects on the semiconductor chip 100, and can reduce cost of the chip.

The pads 412, 413, and 414 may be removed in the following manner. In descending order of the density of the interconnects calculated in the interconnect density calculation process 402, the number of the pads which have to be removed, and a designated value of a ratio of an area of the interconnects are determined. Then, the pads in the regions where the number of the pads and the ratio of the area of the interconnects are the designated values or higher are removed. The designated value of the ratio of the area of the interconnects can be determined based on a designated value of a ratio of an area of the interconnects based on limitations on an LSI manufacturing process, or a designated value of the degree of densification of the interconnects based on a placement and routing tool.

In FIG. 7, the pads are arranged in the rectangular dot grid pattern in one of the corner portions, and some of the pads 412 etc. are removed. However, the removal of the pads is not limited thereto, and the pads may be arranged in the staggered dot pattern in one of the corner portions, and some of the pads may be removed.

(Fourth Alternative of First Exemplary Embodiment)

Figure 8:
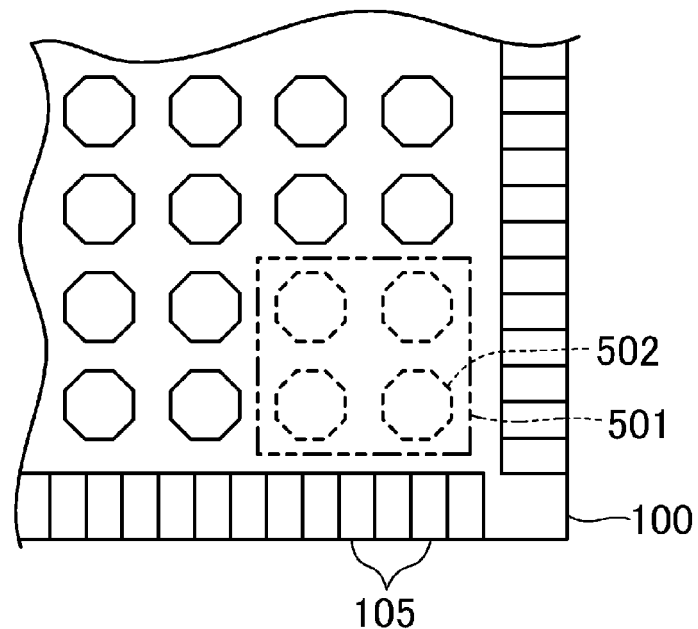
FIG. 8 is a plan view partially illustrating a semiconductor integrated circuit device according to a fourth alternative of the first exemplary embodiment.

FIG. 8 is a plan view illustrating one of corner portions of a semiconductor integrated circuit device of a fourth alternative of the first exemplary embodiment.

Pads 502 are removed from an analog core 501 formed on the chip. This structure can prevent propagation of noise of signals of the pads on the analog core 501 to the analog core 501, thereby improving an operation characteristic of the semiconductor chip 100.

In FIG. 8, some of the pads 502 arranged in one of the corner portions in the rectangular dot grid pattern are removed. However, the removal of the pads is not limited thereto, and some of the pads arranged in one of the corner portions in the staggered dot pattern may be removed.

In the semiconductor integrated circuit device shown in FIG. 1, the first pads 101 are arranged in the rectangular dot grid pattern, and the second pads 102 are arranged in the staggered dot pattern on the semiconductor chip 100. When one or more rows of the pads closest to a perimeter of the semiconductor chip 100 are used as power supply terminals, malfunction of the semiconductor chip 100 due to warpage of the semiconductor chip 100 etc. is less likely to occur, and the cost of the chip can be reduced.

Second Exemplary Embodiment

A semiconductor integrated circuit device of a second exemplary embodiment, and a method for designing the same will be described with reference to the drawings.

In the second exemplary embodiment, a semiconductor integrated circuit device for improving efficiency in routing interconnects between area pads and input/output cells will be described.

Figure 17:
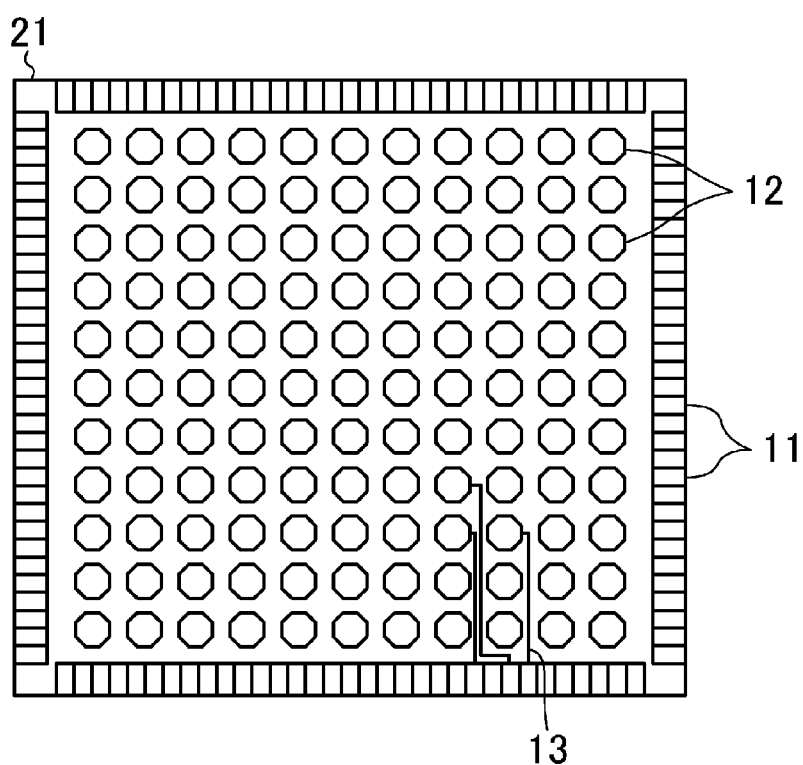
FIG. 17 is a plan view illustrating a semiconductor chip constituting a conventional flip-chip semiconductor integrated circuit device.
Figure 18:
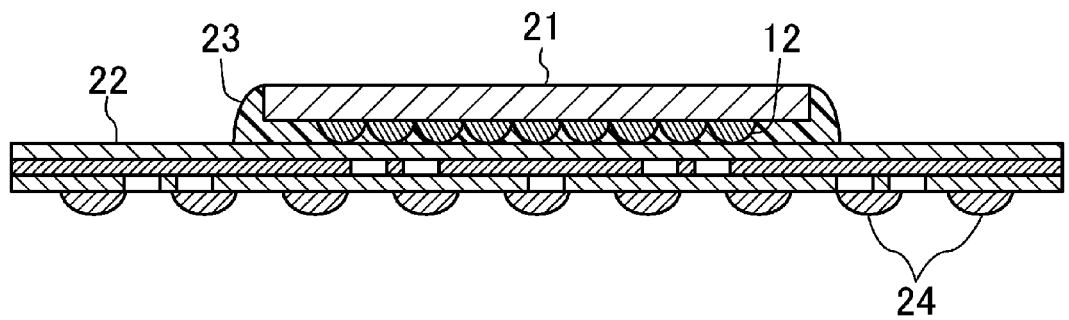
FIG. 18 is a cross-sectional view illustrating the conventional flip-chip semiconductor integrated circuit device.

In a conventional semiconductor integrated circuit device, a plurality of input/output cells 11 are arranged on a peripheral portion of a chip as shown in FIG. 17. In this case, interconnects 13 between pads 12 and the input/output cells 11 have to be relatively long to extend from a center portion to the peripheral portion of the chip. This is disadvantageous because operation timing of the interconnects 13 is impaired. The interconnects 13 are densely routed between the pads 12, thereby increasing an area of the chip. Further, in arranging the input/output cells 11 in an internal region of the chip, loss of area of the internal region of the chip, and adverse effects on timing operation of internal circuits have to be compensated. In the internal region of the chip, only a small area is left for arranging the input/output cells 11 due to recent miniaturization of LSI and increase in the number of interconnects. Therefore, it is not easy to ensure the region for arranging the input/output cells 11 near the pads 12.

In the second exemplary embodiment, to arrange the input/output cells near the pads on the chip, attention is focused on standard cell regions for arranging standard cells, and the input/output cells are arranged in the standard cell regions together with the standard cells. This can resolve the above-described disadvantage. When the input/output cells which consume large power are arranged in the standard cell regions, operation of the standard cells which are internal circuits may become unstable due to voltage drop, noise from a power supply, etc. The second exemplary embodiment can also resolve such a disadvantage.

Figure 9:
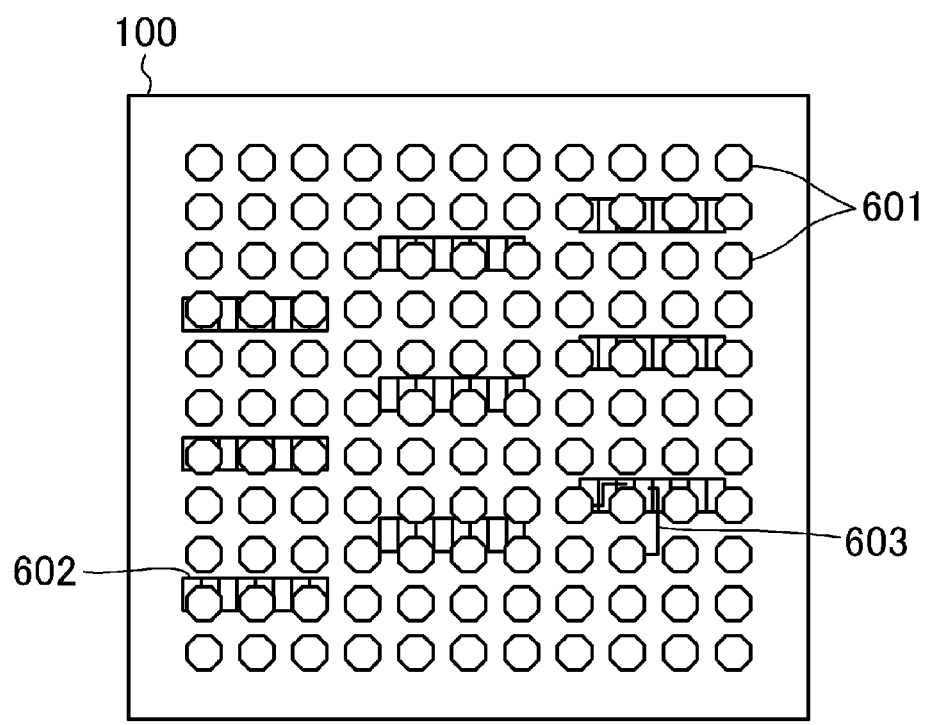
FIG. 9 is a plan view illustrating a semiconductor integrated circuit device according to a second exemplary embodiment.

FIG. 9 is a plan view illustrating a structure of the semiconductor integrated circuit device of the second exemplary embodiment. The semiconductor integrated circuit device includes pads 601 on a semiconductor chip 100, input/output cells 602 arranged in standard cell regions, and pad interconnects 603. With the input/output cells 602 arranged in the standard cell regions, the pad interconnects 603 between the pads 601 and the input/output cells 602 can be shortened. This enhances timing performance of circuit operation by the pad interconnects 603 between the input/output cells 602 and the pads 601, thereby improving an operation characteristic of the chip. Since the pad interconnects 603 are shortened, a region for the interconnects between the pads 601 can be reduced, thereby reducing cost of the chip.

Figure 10:
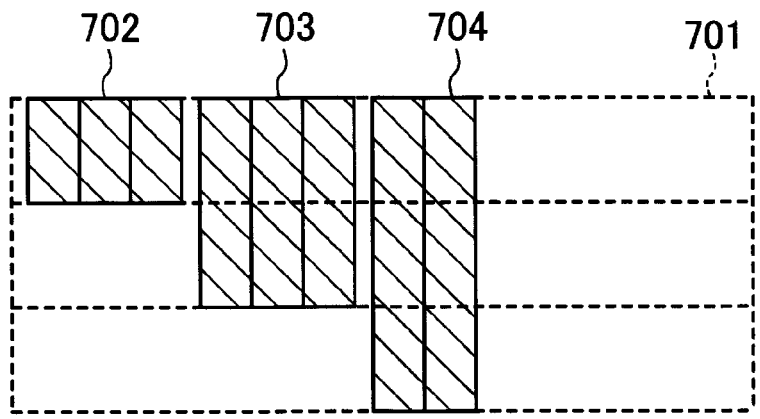
FIG. 10 is a plan view illustrating input/output cells of the semiconductor integrated circuit device according to the second exemplary embodiment.

FIG. 10 shows heights of the input/output cells arranged in a standard cell region 701. When the input/output cells are first input/output cells 702 which are as tall as the standard cells, second input/output cells 703 which are twice as tall as the standard cells, third input/output cells 704 which are three times taller than the standard cells, or input/output cells which are three or more times taller than the standard cell region, the input/output cells 702 etc. can efficiently be arranged without increasing an area of the chip. This can reduce an area and cost of the chip.

Figure 11:
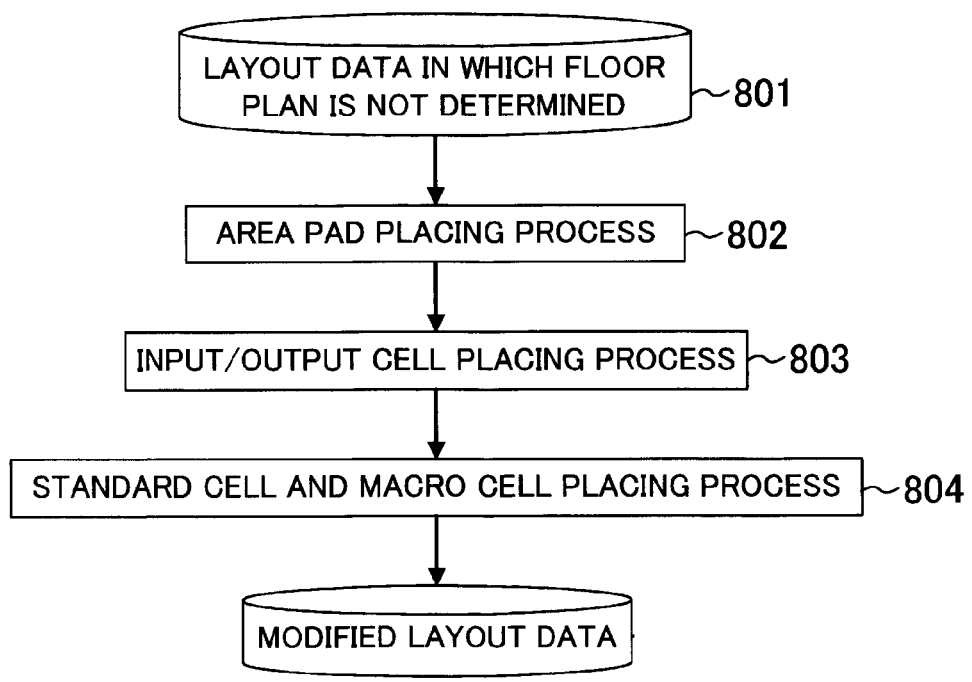
FIG. 11 is a flowchart illustrating a method for designing the semiconductor integrated circuit device according to the second exemplary embodiment.

FIG. 11 is a flowchart illustrating a method for designing the semiconductor integrated circuit device of the second exemplary embodiment.

As shown in FIG. 11, the pads are placed on the semiconductor chip in an area pad placing process 802 based on a layout data 801 in which a floor plan is not determined.

The input/output cells are placed in an input/output cell placing process 803.

Internal circuit elements of the chip are placed in a standard cell and macro cell placing process 804.

Since the area pads are placed first in this way, a floor plan in which the pads are preferentially placed can be obtained. Thus, efficiency in connecting the semiconductor chip with the outside improves, thereby reducing the cost of the chip.

Figure 12:
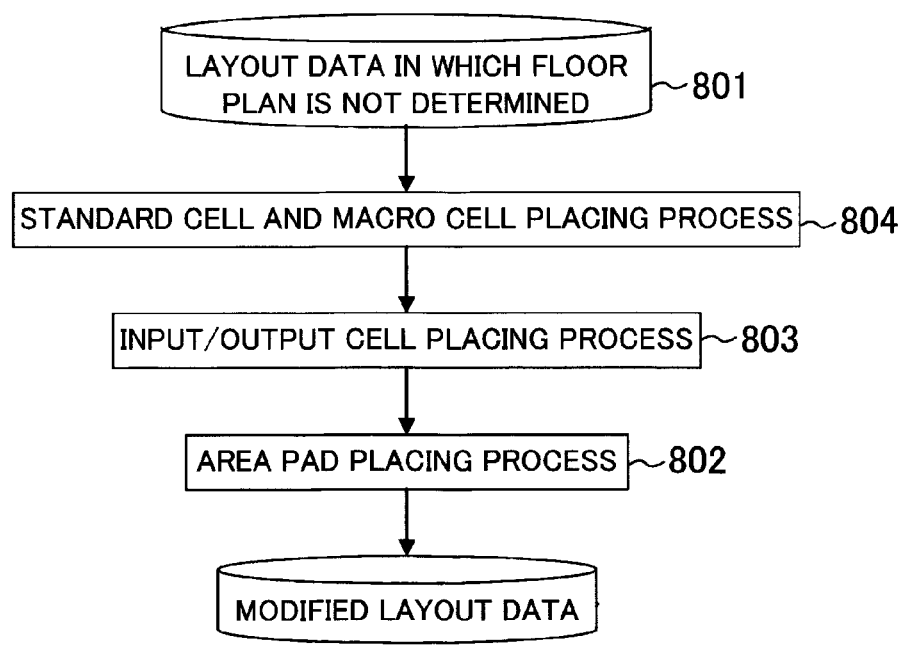
FIG. 12 is a flowchart illustrating an alternative of the method for designing the semiconductor integrated circuit device according to the second exemplary embodiment.

FIG. 12 shows a first alternative of the method for designing the semiconductor integrated circuit device of the second exemplary embodiment.

As shown in FIG. 12, the internal circuit elements of the chip are placed in the standard cell and macro cell placing process 804 based on the layout data 801 in which the floor plan is not determined.

The input/output cells are placed in the input/output cell placing process 803.

The area pads are placed in the area pad placing process 802.

Since the internal circuit elements of the chip are placed first in this way, a floor plan in which the internal circuit elements of the chip are preferentially placed can be obtained. Thus, efficiency in connecting the internal circuit elements of the chip improves, thereby reducing the cost of the chip.

In the methods for designing the semiconductor integrated circuit device shown in FIGS. 11 and 12, when an interconnect resistance value, an interconnect capacity value, a constraint value for signal arrival time, a constraint value for interconnect length, or a constraint value for interconnect fanout is set, and a constraint on the interconnects requiring that the set value is equal to or less than a predetermined value is satisfied in placing the LSI internal circuit elements, the plurality of input/output cells, and the plurality of pads, the chip can fulfill required performance specification. This can improve quality of the chip.

(First Alternative of Second Exemplary Embodiment)

Figure 13:
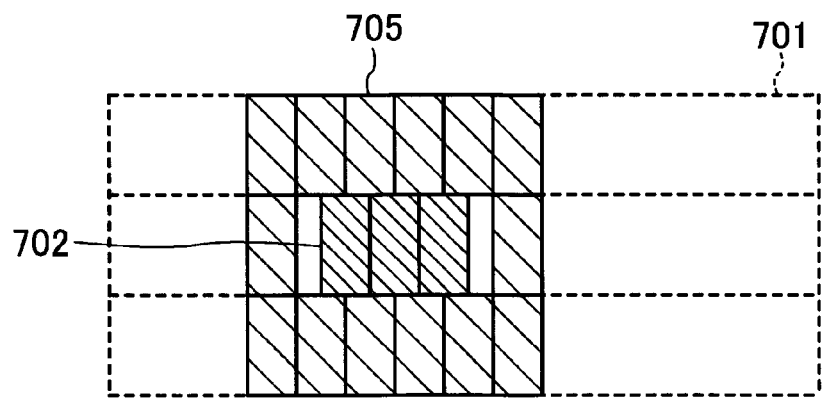
FIG. 13 is a plan view partially illustrating a semiconductor integrated circuit device according to a first alternative of the second exemplary embodiment.

FIG. 13 is a plan view illustrating a major part of a semiconductor integrated circuit device according to a first alternative of the second exemplary embodiment.

As shown in FIG. 13, a feature of the first alternative is that the input/output cells 702 arranged in the standard cell region 701 are surrounded by a plurality of power supply capacitor cells 705. This structure can reduce the occurrence of voltage drop and noise from a power supply due to operation of the input/output cells 702. Thus, reliability of the semiconductor chip is less likely to decrease.

(Second Alternative of Second Exemplary Embodiment)

Figure 14:
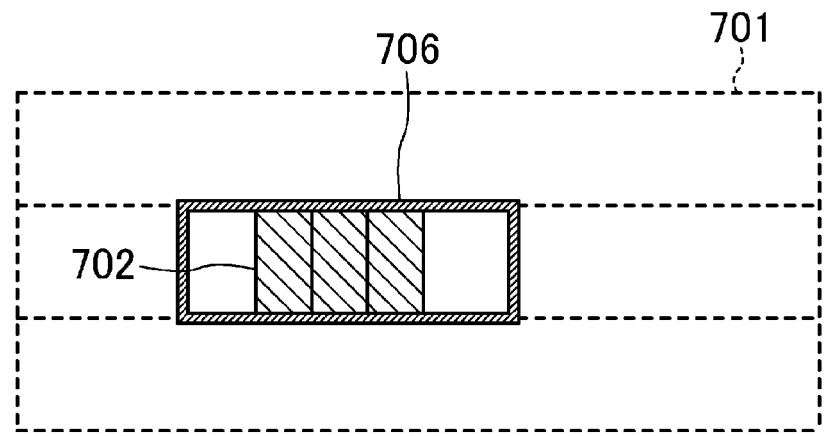
FIG. 14 is a plan view partially illustrating a semiconductor integrated circuit device according to a second alternative of the second exemplary embodiment.

FIG. 14 is a plan view illustrating a major part of a semiconductor integrated circuit device according to a second alternative of the second exemplary embodiment.

As shown in FIG. 14, a feature of the second alternative is that the input/output cells 702 arranged in the standard cell region 701 are connected by a power supply interconnect 706 provided around the input/output cells 702. With the provision of the dedicated power supply interconnect around the input/output cells 702, the occurrence of voltage drop and noise from a power supply due to operation of the input/output cells 702 can be reduced. Thus, reliability of the semiconductor chip is less likely to decrease.

In FIG. 10, the standard cells are not arranged in the standard cell region 701 in which the input/output cells 702, 703, and 704 are arranged. This can prevent propagation of effect of voltage drop and noise from a power supply due to operation of the input/output cells 701 etc. to the standard cells.

(Third Alternative of Second Exemplary Embodiment)

Figure 15:
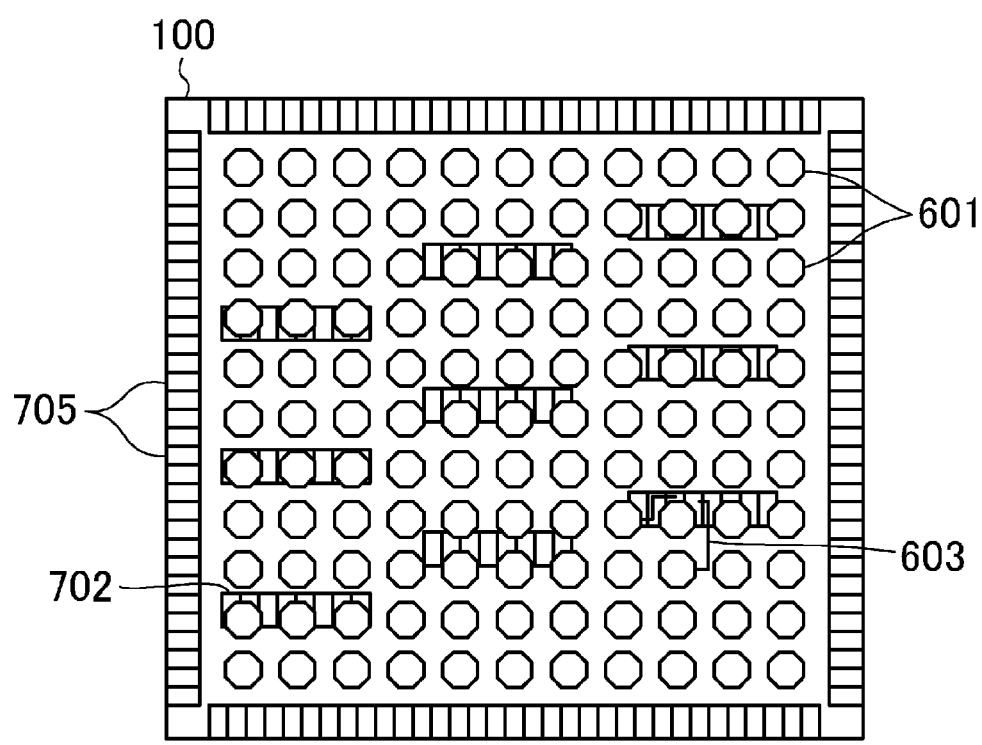
FIG. 15 is a plan view illustrating a semiconductor integrated circuit device according to a third alternative of the second exemplary embodiment.

FIG. 15 is a plan view illustrating a structure of a semiconductor integrated circuit device according to a third alternative of the second exemplary embodiment.

As shown in FIG. 15, pads 601, input/output cells 702 arranged in standard cell regions, and pad interconnects 603 are provided on the semiconductor chip 100. Power supply capacitor cells 705 are arranged on the peripheral portion of the semiconductor chip 100. This allows efficient use of the area of the chip, and can reduce the occurrence of voltage drop and noise from a power supply. Thus, reliability of the semiconductor chip 100 is less likely to decrease.

(Fourth Alternative of Second Exemplary Embodiment)

Figure 16:
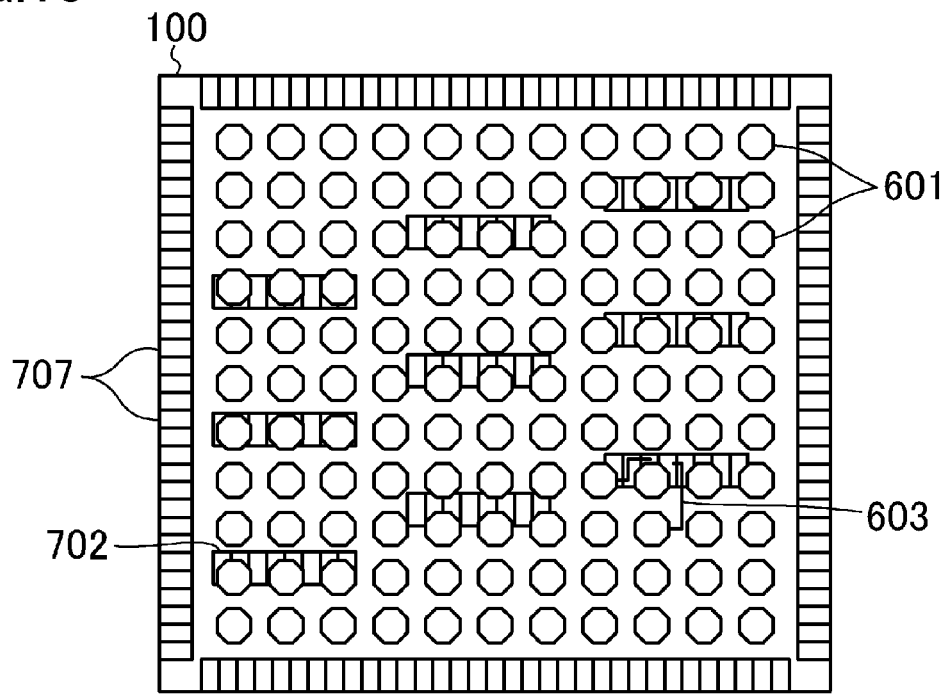
FIG. 16 is plan view illustrating a semiconductor integrated circuit device according to a fourth alternative of the second exemplary embodiment.

FIG. 16 is a plan view illustrating a structure of a semiconductor integrated circuit device according to a fourth alternative of the second exemplary embodiment.

As shown in FIG. 16, pads 601, input/output cells 702 arranged in the standard cell regions, and pad interconnects 603 are provided on the semiconductor chip 100. Electrostatic discharge (ESD) protection cells 707 are arranged on the peripheral portion of the semiconductor chip 100. This allows efficient use of the area of the chip, and can reduce the occurrence of electrostatic breakdown of the semiconductor chip 100, thereby improving reliability of the semiconductor chip 100.

The components of the first and second exemplary embodiments described above may optionally be combined. For example, referring to FIG. 1 and FIG. 9, the semiconductor integrated circuit device can include: a semiconductor chip 100 including a plurality of input/output cells 105, 602, at least one or more of the plurality of input/output cells 105, 602 arranged in standard cell regions for arranging standard cells; a plurality of pads 101, 102, 601 formed on a surface of the semiconductor chip; and interconnects 103, 603, formed on the surface of the semiconductor chip to electrically connect at least one of the plurality of input/output cells and at least one of the plurality of pads, wherein a first group 101 of the plurality of pads are located in a center portion of the semiconductor chip and arranged in a first pattern, and a second group 102 of the plurality of pads are located in at least one of four corner portions of the semiconductor chip and arranged in a second pattern, an angle of the second pattern is offset from an angle of the first pattern by an acute angle greater than 0 (for example, 45 degrees).

The semiconductor integrated circuit device, and the method for designing the same allow efficient routing of the interconnects which connect the area pads and the input/output cells arranged on the surface of the chip with reduced cost. Thus, the semiconductor integrated circuit device and the method for designing the same are useful for semiconductor integrated circuit devices applicable to flip-chip mounting, and methods for designing the same.

What is claimed is:

1. A semiconductor integrated circuit device comprising:
a semiconductor chip including input/output cells;
pads formed on a surface of the semiconductor chip; and
interconnects formed on the surface of the semiconductor chip to electrically connect one or more of the input/output cells and one or more of the pads, wherein
a first plurality of the pads located in a center portion of the semiconductor chip are arranged in a rectangular dot grid pattern,
a second plurality of the pads located in two corner portions which are disposed in a same side of the semiconductor chip are arranged in a staggered dot pattern, and
a third plurality of the pads located between the two corner portions are arranged in the rectangular dot grid pattern.

2. The semiconductor integrated circuit device of claim 1, wherein
each of the pads arranged in the rectangular dot grid pattern is in the shape of a rectangle when viewed in plan, and
each of the pads arranged in the staggered dot pattern is in the shape of a rectangle which is tilted at an angle of 45° relative to the rectangular shape of the pads arranged in the rectangular dot grid pattern when viewed in plan.

3. The semiconductor integrated circuit device of claim 1, wherein
a surface metal layer of each of the plurality of pads is in the shape of a rectangle when viewed in plan, and
a lower metal layer below the surface metal layer of each of the pads arranged in the staggered dot pattern is in the shape of a rectangle which is tilted at an angle of 45° relative to the rectangular shape of the surface metal layer when viewed in plan.

4. The semiconductor integrated circuit device of claim 1, wherein
the pads arranged in the rectangular dot grid pattern are power supply terminals, and the pads arranged in the staggered dot pattern are signal terminals.

5. The semiconductor integrated circuit device of claim 1, wherein
pads are not provided in a pad forming region or a region around the pad forming region of a designated area where density of the interconnects is high.

6. The semiconductor integrated circuit device of claim 1, wherein
pads are not provided in a pad forming region or a region around the pad forming region of a designated area where an analog element is present.

7. The semiconductor integrated circuit device of claim 1, wherein
one or more rows of the pads closest to an outer perimeter of the semiconductor chip are power supply terminals.

8. The semiconductor integrated circuit device of claim 1, wherein
an interconnect connecting one of the input/output cells with one of the second plurality of pads intersects the perimeter of the chip at an angle consistent with the staggered dot pattern.

9. The semiconductor integrated circuit device of claim 1, wherein
the interconnect connecting one of the input/output cells with one of the second plurality of pads intersects the one of the second plurality of pads at an angle of substantially 90 degrees.

10. The semiconductor integrated circuit device of claim 1, wherein
a distance between adjacent two of the second plurality of pads arranged in the staggered pattern is longer than a distance between adjacent two of the first plurality of pads arranged in the rectangular dot grid pattern.

11. The semiconductor integrated circuit device of claim 1, wherein
the second plurality of pads arranged in the staggered pattern includes at least three pads.

12. The semiconductor integrated circuit device of claim 1, wherein the input/output cells are located on a peripheral area outside the second plurality of pads and the third plurality of the pads.

13. A semiconductor integrated circuit device comprising:
a semiconductor chip including a plurality of input/output cells;
a plurality of pads formed on a surface of the semiconductor chip; and
interconnects formed on the surface of the semiconductor chip to electrically connect at least one of the plurality of input/output cells and at least one of the plurality of pads, wherein
a first group of the plurality of pads are located in a center portion of the semiconductor chip and arranged in a first pattern,
a second group of the plurality of pads are located in two corner portions which are disposed in a same side of the semiconductor chip and arranged in a second pattern, an angle of the second pattern is offset from an angle of the first pattern by an acute angle greater than 0 degrees, and
a third group of the plurality of pads are located between the two corner portions and arranged in the first pattern.

14. The semiconductor integrated circuit device of claim 13, wherein
an interconnect connecting one of the input/output cells with one of the second plurality of pads intersects the perimeter of the chip at an angle consistent with an angle of the second pattern.

15. The semiconductor integrated circuit device of claim 13, wherein
the interconnect connecting one of the input/output cells with one of the second plurality of pads intersects the one of the second plurality of pads at an angle of substantially 90 degrees.

16. A semiconductor integrated circuit device comprising:
a semiconductor chip including a plurality of input/output cells;
a plurality of pads formed on a surface of the semiconductor chip; and
interconnects formed on the surface of the semiconductor chip to electrically connect at least one of the plurality of input/output cells and at least one of the plurality of pads, wherein
a first group of the plurality of pads located in a cross-shaped center portion of the semiconductor chip extending to outer edges of a pad region of the semiconductor chip, the first group of the plurality of pads arranged in a first pattern,
a second group of the plurality of pads located in at least two corner portions on the same side of the pad region of the semiconductor chip, the second group of the plurality of pads arranged in a second pattern, an angle of the second pattern is offset from an angle of the first pattern by an acute angle greater than 0 degrees, and
the second group of the plurality of pads bound on two sides by the first group of the plurality of pads.

* * * * *